United States Patent
Fox et al.

(10) Patent No.: US 9,607,673 B1
(45) Date of Patent: *Mar. 28, 2017

(54) METHODS AND SYSTEMS FOR PIN-EFFICIENT MEMORY CONTROLLER INTERFACE USING VECTOR SIGNALING CODES FOR CHIP-TO-CHIP COMMUNICATION

(71) Applicant: Kandou Labs S.A., Lausanne (CH)

(72) Inventors: John Fox, Lausanne (CH); Brian Holden, Monte Sereno, CA (US); Amin Shokrollahi, Preverenges (CH); Anant Singh, Pully (CH); Giuseppe Surace, Lausanne (CH)

(73) Assignee: KANDOU LABS S.A. (CH)

( * ) Notice: Subject to any disclaimer, the term of this patent is extended or adjusted under 35 U.S.C. 154(b) by 0 days.

This patent is subject to a terminal disclaimer.

(21) Appl. No.: 14/974,698

(22) Filed: Dec. 18, 2015

Related U.S. Application Data

(63) Continuation of application No. 14/108,316, filed on Dec. 16, 2013, now Pat. No. 9,251,873.

(60) Provisional application No. 61/738,329, filed on Dec. 17, 2012.

(51) Int. Cl.
  *G11C 7/22* (2006.01)
  *G11C 8/10* (2006.01)

(52) U.S. Cl.
  CPC . *G11C 7/22* (2013.01); *G11C 8/10* (2013.01)

(58) Field of Classification Search
  CPC .......... G11C 7/22; G11C 8/10; G06F 13/1668
  See application file for complete search history.

(56) References Cited

U.S. PATENT DOCUMENTS

| | | | |
|---|---|---|---|
| 3,196,351 | A | 7/1965 | Slepian |
| 3,636,463 | A | 1/1972 | Ongkiehong |
| 3,939,468 | A | 2/1976 | Mastin |
| 4,163,258 | A | 7/1979 | Ebihara |
| 4,181,967 | A | 1/1980 | Nash |
| 4,206,316 | A | 6/1980 | Burnsweig |

(Continued)

FOREIGN PATENT DOCUMENTS

| | | |
|---|---|---|
| CN | 101478286 | 7/2009 |
| EP | 2039221 | 2/2013 |

(Continued)

OTHER PUBLICATIONS

Abbasfar, A., "Generalized Differentialyyyyyy Vector Signaling", IEEE International Conference on Communications, ICC '09, (Jun. 14, 2009), pp. 1-5.

(Continued)

*Primary Examiner* — Farley Abad
(74) *Attorney, Agent, or Firm* — Invention Mine LLC

(57) ABSTRACT

Systems and methods are described for transmitting data over physical channels to provide a high speed, low latency interface such as between a memory controller and memory devices. Controller-side and memory-side embodiments of such channel interfaces are disclosed which require a low pin count and have low power utilization. In some embodiments of the invention, different voltage, current, etc. levels are used for signaling and more than two levels may be used, such as a vector signaling code wherein each wire signal may take on one of four signal values.

20 Claims, 6 Drawing Sheets

(56) References Cited

U.S. PATENT DOCUMENTS

| | | |
|---|---|---|
| 4,276,543 A | 6/1981 | Miller |
| 4,486,739 A | 12/1984 | Franaszek |
| 4,499,550 A | 2/1985 | Ray, III |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,053,974 A | 10/1991 | Penz |
| 5,166,956 A | 11/1992 | Baltus |
| 5,168,509 A | 12/1992 | Nakamura |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A * | 9/1995 | Hecht .............. G06K 19/06037 235/456 |
| 5,459,465 A | 10/1995 | Kagey |
| 5,461,379 A | 10/1995 | Weinman |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,659,353 A | 8/1997 | Kostreski |
| 5,727,006 A | 3/1998 | Dreyer |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattscneider |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,346,907 B1 | 2/2002 | Dacy |
| 6,359,931 B1 | 3/2002 | Perino |
| 6,378,073 B1 | 4/2002 | Davis |
| 6,398,359 B1 | 6/2002 | Silverbrook |
| 6,404,820 B1 | 6/2002 | Postol |
| 6,417,737 B1 | 7/2002 | Moloudi |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,686,879 B2 | 2/2004 | Shattil |
| 6,766,342 B2 | 7/2004 | Kechriotis |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,999,516 B1 | 2/2006 | Rajan |
| 7,023,817 B2 | 4/2006 | Kuffner |
| 7,053,802 B2 | 5/2006 | Cornelius |
| 7,075,996 B2 | 7/2006 | Simon |
| 7,085,153 B2 | 8/2006 | Ferrant |
| 7,085,336 B2 | 8/2006 | Lee |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,180,949 B2 | 2/2007 | Kleveland |
| 7,184,483 B2 | 2/2007 | Rajan |
| 7,269,212 B1 | 9/2007 | Chau |
| 7,335,976 B2 | 2/2008 | Chen |
| 7,339,990 B2 | 3/2008 | Hidaka |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,370,264 B2 | 5/2008 | Worley |
| 7,389,333 B2 | 6/2008 | Moore |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,535,957 B2 | 5/2009 | Ozawa |
| 7,570,704 B2 | 8/2009 | Nagarajan |
| 7,599,390 B2 | 10/2009 | Pamarti |
| 7,616,075 B2 | 11/2009 | Kushiyama |
| 7,620,116 B2 | 11/2009 | Bessios |
| 7,633,850 B2 | 12/2009 | Ahn |
| 7,639,596 B2 | 12/2009 | Cioffi |
| 7,643,588 B2 | 1/2010 | Visalli |
| 7,656,321 B2 | 2/2010 | Wang |
| 7,694,204 B2 | 4/2010 | Schmidt |
| 7,697,915 B2 | 4/2010 | Behzad |
| 7,706,456 B2 | 4/2010 | Laroia |
| 7,706,524 B2 | 4/2010 | Zerbe |
| 7,746,764 B2 | 6/2010 | Rawlins |
| 7,787,572 B2 | 8/2010 | Scharf |
| 7,804,361 B2 | 9/2010 | Lim |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | Abou Rjeily |
| 8,245,094 B2 | 8/2012 | Jiang |
| 8,253,454 B2 | 8/2012 | Lin |
| 8,279,094 B2 | 10/2012 | Abbasfar |
| 8,295,250 B2 | 10/2012 | Gorokhov |
| 8,310,389 B1 | 11/2012 | Chui |
| 8,365,035 B2 | 1/2013 | Hara |
| 8,406,315 B2 | 3/2013 | Tsai |
| 8,429,495 B2 | 4/2013 | Przybylski |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |

(56) References Cited

U.S. PATENT DOCUMENTS

| | | |
|---|---|---|
| 8,462,891 B2 | 6/2013 | Kizer |
| 8,472,513 B2 | 6/2013 | Malipatil |
| 8,498,344 B2 | 7/2013 | Wilson |
| 8,498,368 B1 * | 7/2013 | Husted .................. H03G 3/3052 |
| | | 375/316 |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,638,241 B2 | 1/2014 | Sudhakaran |
| 8,649,445 B2 | 2/2014 | Cronie |
| 8,649,556 B2 | 2/2014 | Wedge |
| 8,649,840 B2 | 2/2014 | Sheppard, Jr. |
| 8,687,968 B2 | 4/2014 | Nosaka |
| 8,711,919 B2 | 4/2014 | Kumar |
| 8,718,184 B1 | 5/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,831,440 B2 | 9/2014 | Yu |
| 8,879,660 B1 | 11/2014 | Peng |
| 8,897,134 B2 | 11/2014 | Kern |
| 8,949,693 B2 | 2/2015 | Ordentlich |
| 8,951,072 B2 | 2/2015 | Hashim |
| 8,975,948 B2 | 3/2015 | Gonzalez Diaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,069,995 B1 | 6/2015 | Cronie |
| 9,077,386 B1 | 7/2015 | Holden |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,165,615 B2 | 10/2015 | Amirkhany |
| 9,172,412 B2 | 10/2015 | Kim |
| 9,197,470 B2 | 11/2015 | Okunev |
| 9,281,785 B2 | 3/2016 | Sjoland |
| 9,362,974 B2 | 6/2016 | Fox |
| 9,374,250 B1 | 6/2016 | Musah |
| 2002/0044316 A1 | 4/2002 | Myers |
| 2002/0057592 A1 | 5/2002 | Robb |
| 2002/0154633 A1 * | 10/2002 | Shin ...................... H04L 47/10 |
| | | 370/389 |
| 2002/0163881 A1 | 11/2002 | Dhong |
| 2002/0174373 A1 | 11/2002 | Chang |
| 2003/0086366 A1 | 5/2003 | Branlund |
| 2003/0146783 A1 | 8/2003 | Bandy |
| 2004/0003336 A1 | 1/2004 | Cypher |
| 2004/0003337 A1 | 1/2004 | Cypher |
| 2004/0156432 A1 | 8/2004 | Hidaka |
| 2005/0057379 A1 | 3/2005 | Jansson |
| 2005/0174841 A1 | 8/2005 | Ho |
| 2005/0213686 A1 | 9/2005 | Love |
| 2006/0115027 A1 | 6/2006 | Srebranig |
| 2007/0188367 A1 | 8/2007 | Yamada |
| 2007/0194848 A1 | 8/2007 | Bardsley |
| 2007/0263711 A1 | 11/2007 | Theodor Kramer |
| 2007/0265533 A1 | 11/2007 | Tran |
| 2008/0013622 A1 | 1/2008 | Bao |
| 2008/0104374 A1 | 5/2008 | Mohamed |
| 2008/0284524 A1 | 11/2008 | Kushiyama |
| 2009/0059782 A1 | 3/2009 | Cole |
| 2009/0251222 A1 | 10/2009 | Khorram |
| 2010/0023838 A1 | 1/2010 | Shen |
| 2010/0046644 A1 | 2/2010 | Mazet |
| 2010/0180143 A1 | 7/2010 | Ware |
| 2010/0296556 A1 | 11/2010 | Rave |
| 2011/0072330 A1 | 3/2011 | Kolze |
| 2011/0150495 A1 | 6/2011 | Nosaka |
| 2011/0291758 A1 | 12/2011 | Hsieh |
| 2011/0299555 A1 | 12/2011 | Cronie |
| 2011/0317587 A1 * | 12/2011 | Lida .................. H04L 12/2832 |
| | | 370/254 |
| 2012/0008662 A1 | 1/2012 | Gardiner |
| 2012/0152901 A1 | 6/2012 | Nagomy |
| 2012/0161945 A1 | 6/2012 | Single |
| 2013/0010892 A1 | 1/2013 | Cronie |
| 2013/0049863 A1 | 2/2013 | Chiu |
| 2013/0229294 A1 | 9/2013 | Matsuno |
| 2014/0198841 A1 | 7/2014 | George |
| 2014/0226455 A1 | 8/2014 | Schumacher |
| 2015/0010044 A1 | 1/2015 | Zhang |
| 2015/0078479 A1 | 3/2015 | Whitby-Strevens |
| 2015/0146771 A1 | 5/2015 | Walter |
| 2015/0199543 A1 | 7/2015 | Winoto |
| 2015/0333940 A1 | 11/2015 | Shokrollahi |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 mailed Sep. 22, 2011.

International Search Report and Written Opinion for PCT/EP2011/074219 mailed Jul. 4, 2012.

International Search Report and Written Opinion for PCT/EP2012/052767 mailed May 11, 2012.

International Search Report and Written Opinion for PCT/US14/052986 mailed Nov. 24, 2014.

International Search Report and Written Opinion from PCT/US2014/034220 mailed Aug. 21, 2014.

International Search Report and Written Opinion of the International Searching Authority, mailed Jul. 14, 2011 in International Patent Application S.N. PCT/EP2011/002170, 10 pages.

International Search Report and Written Opinion of the International Searching Authority, mailed Nov. 5, 2012, in International Patent Application S.N. PCT/EP2012/052767, 7 pages.

International Search Report for PCT/US2014/053563, dated Nov. 11, 2014, 2 pages.

(56) References Cited

OTHER PUBLICATIONS

Notification of Transmittal of the International Search Report and the Written Opinion of the International Searching Authority, or The Declaration for PCT/EP2013/002681, dated Feb. 25, 2014, 15 pages.
Poulton, et al., "Multiwire Differential Signaling", UNC-CH Department of Computer Science Version 1.1, Aug. 6, 2003.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicationes, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
"Introduction to: Analog Computers and the DSPACE System," Course Material ECE 5230 Spring 2008, Utah State University, www.coursehero.com, 12 pages.
Counts, L., et al., "One-Chip Slide Rule Works with Logs, Antilogs for Real-Time Processing," Analog Devices Computational Products 6, Reprinted from Electronic Design, May 2, 1985, 7 pages.
Design Brief 208 Using the Anadigm Multiplier CAM, Copyright 2002 Anadigm, 6 pages.
Grahame, J., "Vintage Analog Computer Kits," posted on Aug. 25, 2006 in Classic Computing, 2 pages, http://www.retrothing.com/2006/08/classic_analog_.html.
Jiang, A., et al., "Rank Modulation for Flash Memories", IEEE Transactions of Information Theory, Jun. 2006, vol. 55, No. 6, pp. 2659-2673.
Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, mailed Jun. 18, 2015, 13 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Schneider, J., et al., "ELEC301 Project: Building an Analog Computer," Dec. 19, 1999, 8 pages, http://www.clear.rice.edu/elec301/Projects99/anlgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Zouhair Ben-Neticha et al, "The 'streTched-Golay and other codes for high-SNR finite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.

\* cited by examiner

| Tribit | Names | Line code (W3,W2,W1,W0) | Special use |
|---|---|---|---|
| 0b000 | H0, H_START | 1/3, 1/3, 1/3, -1 | Packet start |
| 0b001 | H1 | 1/3, 1/3, -1, 1/3 | |
| 0b010 | H2 | 1/3, -1, 1/3, 1/3 | |
| 0b011 | H3 | -1, 1/3, 1/3, 1/3 | |
| 0b100 | H4 | -1/3, -1/3, -1/3, 1 | |
| 0b101 | H5 | -1/3, -1/3, 1, -1/3 | |
| 0b110 | H6 | -1/3, 1, -1/3, -1/3 | |
| 0b111 | H7, H_IDLE | 1, -1/3, -1/3, -1/3 | Idle |

Figure 6

METHODS AND SYSTEMS FOR PIN-EFFICIENT MEMORY CONTROLLER INTERFACE USING VECTOR SIGNALING CODES FOR CHIP-TO-CHIP COMMUNICATION

CROSS REFERENCES

This application is a Continuation of and claims priority under 35 USC §120 to U.S. application Ser. No. 14/108,316, filed Dec. 16, 2013, entitled "Methods and Systems for Pin-Efficient Memory Controller Interface using Vector Signaling Codes for Chip-to-Chip Communication," which is a non-provisional application claiming priority under 35 USC §119 to U.S. Provisional Application No. 61/738,329, filed Dec. 17, 2012, entitled "Methods And Systems For Pin-Efficient Memory Controller Interface Using Vector Signaling Codes For Chip-To-Chip Communication," all of which are hereby incorporated herein by reference.

The following references are herein incorporated by reference in their entirety for all purposes:

U.S. Patent Publication 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and U.S. patent application Ser. No. 13/463,742, filed May 3, 2012, naming Harm Cronie and Amin Shokrollahi, entitled "Finite State Encoders and Decoders for Vector Signaling Codes" (hereafter called "Cronie IV").

U.S. patent application Ser. No. 13/603,107, filed Sep. 9, 2012, naming Brian Holden and Amin Shokrollahi, entitled "Methods and Systems for Selection of Unions of Vector Signaling Codes for Power and Pin Efficient Chip-To-Chip Communication" (hereinafter called "Holden I").

U.S. patent application Ser. No. 13/671,426, filed Nov. 7, 2012, naming Brian Holden and Amin Shokrollahi, entitled "Crossbar Switch Decoder for Vector Signaling Codes" (hereinafter called "Holden II").

BACKGROUND

In communication systems, information may be transmitted from one physical location to another. Furthermore, it is typically desirable that the transport of this information is reliable, is fast and consumes a minimal amount of resources. One of the most common information transfer mediums is the serial communications link, which may be based on a single wire circuit relative to ground or other common reference, multiple such circuits relative to ground or other common reference, or multiple circuits used in relation to each other. An example of the latter utilizes differential signaling (DS). Differential signaling operates by sending a signal on one wire and the opposite of that signal on a paired wire; the signal information is represented by the difference between the wires rather than their absolute values relative to ground or other fixed reference.

Differential signaling enhances the recoverability of the original signal at the receiver, over single ended signaling (SES), by cancelling crosstalk and other common-mode noise, but a side benefit of the technique is that the Simultaneous Switching Noise (SSN) transients generated by the two signals together is nearly zero; if both outputs are presented with an identical load, the transmit demand on its power supply will be constant, regardless of the data being sent. Any induced currents produced by terminating the differential lines in the receiver will similarly cancel out, minimizing noise induction into the receiving system.

There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, and Cronie IV.

BRIEF SUMMARY

In accordance with at least one embodiment of the invention, processes and apparatuses provide for transmitting data over physical channels to provide a high speed, low latency interface such as between a memory controller and memory devices, requiring low pin count and providing low power utilization. Controller-side and memory-side embodiments of such channel interfaces are disclosed. In some embodiments of the invention, different voltage, current, etc. levels are used for signaling and more than two levels may be used, such as a ternary vector signaling code wherein each wire signal has one of three values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

FIG. 6 describes a use of the Kandou H4 Line Code as part of a communications protocol in accordance with at least one embodiment of the invention.

DETAILED DESCRIPTION

Specialized memory subsystems of modern computer systems utilize dedicated memory controllers to manage access, optimize performance, and improve utilization and reliability. Interconnections between these memory controllers and memory devices must operate at high speeds, delivering reliable and low latency data transfers, while under significant constraints in terms of available pin count and power utilization. Moreover, the design for interfaces to such interconnections is further constrained by implementation requirements, as controller devices are typically implemented using high speed logic processes, while memory devices such as DRAM rely on specialized processes optimized for high storage density and low leakage, but possibly not for fast logic speed. Thus, a successful memory-to-controller interconnection architecture must support implementation in multiple semiconductor processes.

In accordance with at least one embodiment of the invention, this disclosure describes a PHY (Physical Layer interface) and a Link Layer interface for both the controller and memory sides of such an interconnection, without presumption of limitation to the single embodiment provided as a descriptive example. Similarly, a packet format for communication of addressing, data transfer, and control operations using such an interconnection and interfaces is described, as one descriptive use example of a low-latency, pin- and power-efficient embodiment of the invention.

For purposes of description, this document uses the name "Bee" to describe this controller-to-memory interconnection system and/or a device embodying an interface for such interconnection. Without loss of generality, the physical interface between memory controller and memory device is herein described as utilizing point-to-point wire connections between integrated circuit devices, optionally including multidrop bussed interconnection of multiple memory devices and a single controller. Other embodiments of the invention may utilize other physical interfaces, including optical, inductive, capacitive, or electrical interconnection, and/or having more complex connection topologies.

Figure 1:
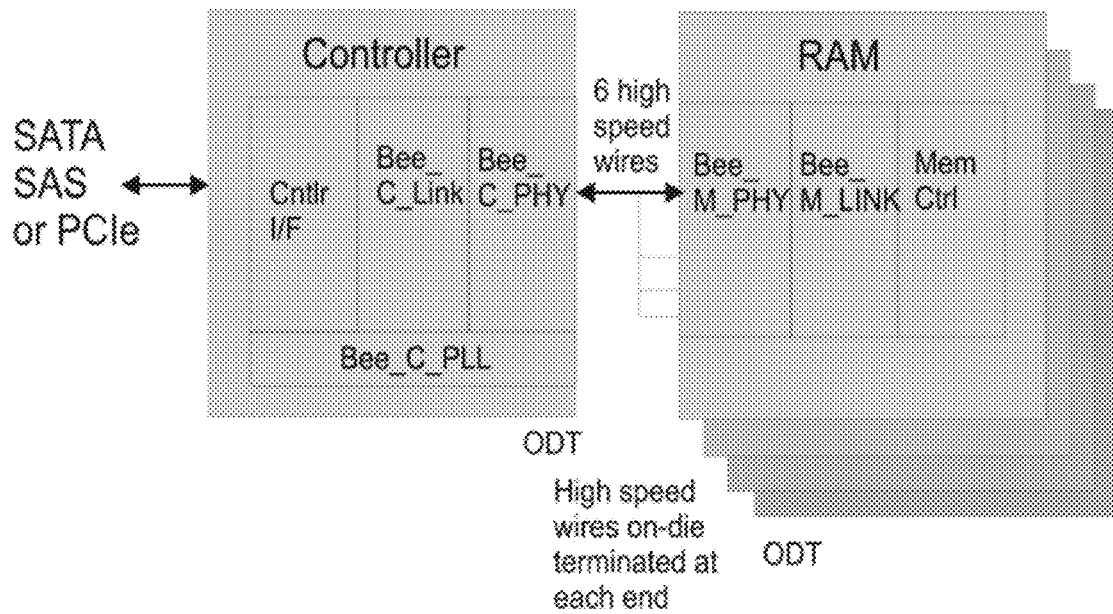
FIG. 1 is a block diagram of an example system comprised of a controller, host interface, memory interface, and memory, in accordance with at least one embodiment of the invention.
Figure 2:
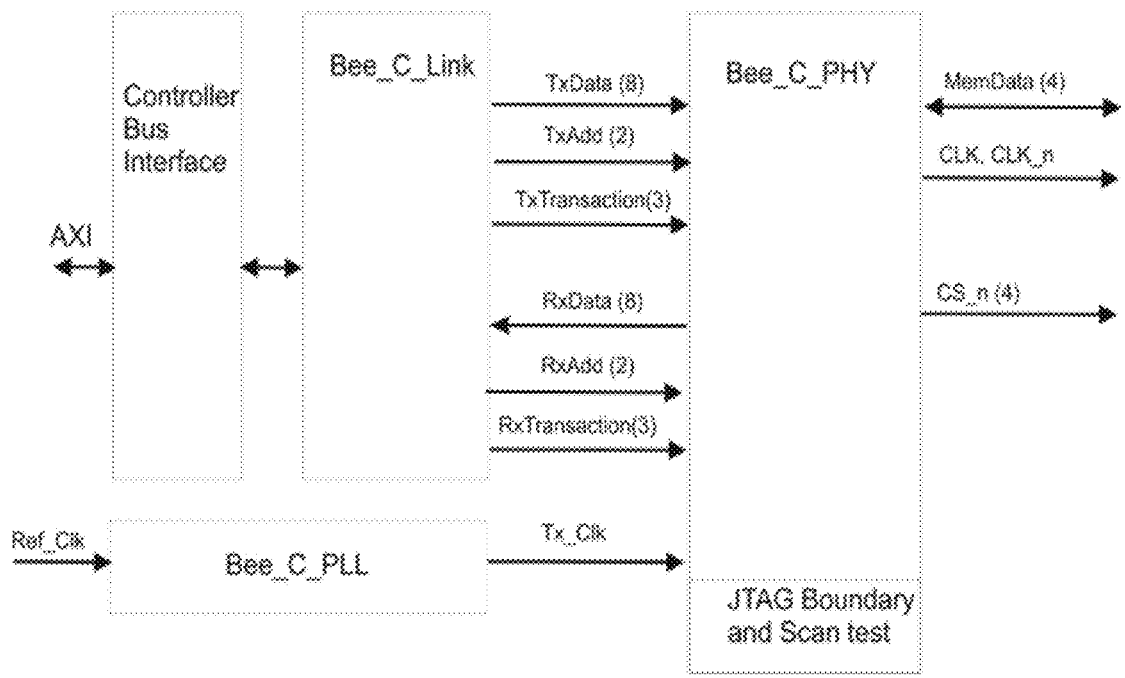
FIG. 2 is a block diagram detailing the controller side of the controller-to-memory interface, in accordance with at least one embodiment of the invention.

FIG. 2 is a block diagram detailing the controller side of the controller-to-memory interface, in accordance with at least one embodiment of the invention.

The Bee Controller side is composed of the Bee_C_Link link layer interface and the Bee_C_PHY physical layer interface. FIG. 2 is a block diagram detailing the controller side of the controller-to-memory interface, in accordance with at least one embodiment of the invention.

The Bee_C_PHY Hard IP packet physical layer interface is implemented in a 60 nm (or so) process and is a low power ensemble coded interface that can deliver 1.5 GB/s in each direction throughput over six high-speed physical wires: four bidirectional data wires and two clock wires. It is optimized for low power. In one embodiment, the interface is a four-wire H4 ensemble mode delivering a 3b4w interface, including six high speed wires total including a differential clock. The interface uses 33% transmitted line power as compared to differential signaling scheme and operates at 4 Gbaud/sec symbol rate, and providing either 1 GB/s or 1.5 GB/s throughput in each direction. In some embodiments, the interface has 3.6 mw/Gbps (43.6 mw) worst case power dissipation (12 Gb/s), and is configured to have 0.50 mm square footprint for interface elements in integrated circuit design. The device interfaces to 1-4 memory devices and connects to the link layer interface (Bee_C_LINK). It may be configured with a 24 bit parallel interface from Bee_C_LINK to PHY and use Command and Address multiplexing implemented in Bee_C_LINK.

In some embodiments, the Package and Channel either does not use equalization or utilizes simple equalization. In general, no skew tolerance circuits required, and a 50 mm FR4 trace maximum channel length may be used. Some embodiments utilize in-package MCM. The interfaces are wire-bond compatible, and may have a tileable layout to allow additional memory interfaces to be implemented on the controller. The pin-out may be chosen to minimize EMI.

In some embodiments, the transmitter sends a half rate clock at either 1.33 GHz or 2 GHz, and data is sent to be aligned to center of rising clock edge, thus no clock and data recovery (CDR) circuit is needed in the RAM. The transmitter slew rate is controlled. The device accepts transaction start and end interface signals from Bee_C_LINK and the device selection may also be input from Bee_C_LINK. In some embodiments, there is a Gearbox selector from the 24 bit system interface to the 3 bit encoder input. The transmitter also encodes a 3-bit input plus start input into a H4 symbol. The transmitter may drive four single ended chip select signals at half speed, and is configured in some embodiments to drive the H_IDLE H4 symbol before the chip select is asserted and then the H_START H4 symbol after the chip select is asserted.

The receiver may be configured with on-die channel termination, and the application of the termination may be determined by the statically wired external pin. In some embodiments, the Bee_C_LINK delivers the receive transaction timing to the PHY, and the Bee_C_LINK delivers the device selection. Further, the decoder may be configured to transform H4 symbols into tri-bits plus the start symbol. The Gearbox transforms the tri-bits plus the start and end packet indications into a 24-bit interface to Bee_C_LINK. Some embodiments may include a Phase aligner aligned via a boot-time routine. The receiver may have low power consumption when all input wires are at the common mode.

Power Management functions may include (i) power-down by removal of power from entire memory device; (ii) power-up transition is not very fast (milliseconds); (iii) standby-Active transitions controlled by input from the controller; and/or (v) additional moderate power standby mode.

Manufacturing aspects may include (i) marginable manufacturing loopback BERT test that is useful in-system between Bee devices; (ii) JTAG 1149.6 boundary and internal scan; (iii) 1 KV HBM and 250 V CDM ESD tolerance; and/or (iv) capable of being fully characterized & extended life tested post-silicon.

Figure 3:
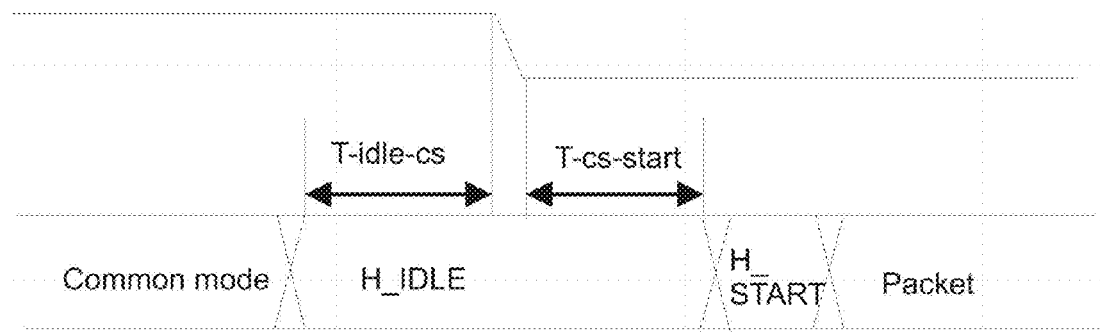
FIG. 3 is a timing diagram for the controller-to-memory interface packet start timing from the aspect of the memory controller, in accordance with at least one embodiment of the invention.

FIG. 3 is a timing diagram for the controller-to-memory interface packet start timing from the aspect of the memory controller, in accordance with at least one embodiment of the invention.

The Bee_C_PLL Hard IP packet physical layer interface is implemented in a 60 nm (or so) process. It is optimized for low power. The phase locked loop (PLL) may be configured as a 22 mw shareable PLL with 100 MHz input and 2 GHz multi-phase output. In some embodiments the PLL may be shared amongst multiple interfaces and/or may be integrated with other device functions.

The Bee_C_Link Hard IP physical layer interface is implemented in a 60 nm (or so) process that multiplexes and times the data for the Bee_C_PHY. It is optimized for low power. It may be configured to connect to a RAM controller containing an AXI bus controller. It also connects to the Bee_C_PHY.

System-side Transmit accepts full memory transactions from the memory controller and formats those transactions into Kandou Memory Link (KML) packets. The interface is configured to interoperate with at least a subset of the OFNI command set to operate the bi-directional request-response data bus. It may be configured to postpends a link CRC, and also to drive those packets into a FIFO along with the start and end of packet information. The interface may manage the Tx FIFO occupancy by pessimistically back-pressuring the bus interface taking into account the input from the receive side. In some embodiments, the interface implements a link layer retry protocol, at the cost of increased latency.

The PHY-side transmit includes a 24 bit interface out of the FIFO to the Bee_C_PHY, and also drives the start and end of packet timing into the gearbox in the Bee_C_PHY.

The PHY-side receive circuit provides the timing windows for the Bee_C_PHY to look for the H_START packet indication, and also provides the Bee_C_PHY and end of packet signal derived from the P_Length field. The receive circuit also accepts a 24 bit input from the interface from Bee_C_PHY and drives it into the FIFO. It may be configured to use cut-thru operations for low latency. The receiver may also check the link CRC and writes the results into the FIFO.

The system-side receive circuit may be configured to manage the Rx FIFO occupancy by pessimistically back-pressuring the Tx side bus interface taking into account both the Rx-FIFO needs of incoming transactions and the existing Rx-FIFO occupancy. It may also be configured to perform response matching of returned packets and handling link layer packets via a non-FIFO path. The receiver circuit also formats the KML responses back into memory transactions suitable for input to the AXI bus controller. In some embodiments, it may also implement a link layer retry protocol, at the cost of latency.

The Bee RAM side comprises the Bee_M_PHY physical layer interface and the Bee_M_Link.link layer interface.

Figure 4:
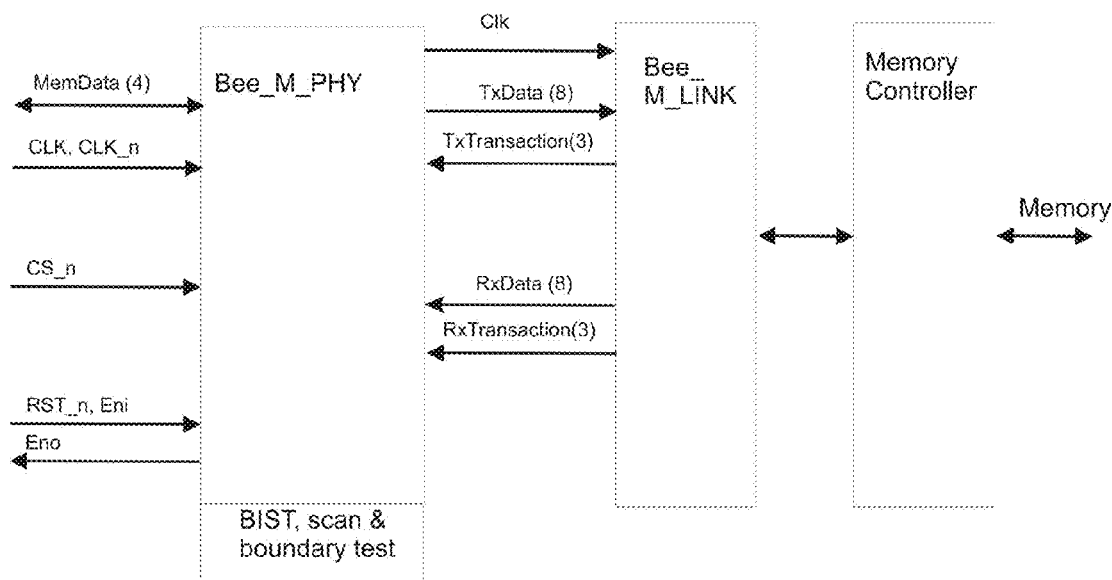
FIG. 4 is a block diagram detailing the memory side of the controller-to-memory interface, in accordance with at least one embodiment of the invention.

FIG. 4 is a block diagram detailing the memory side of this controller-to-memory system, in accordance with at least one embodiment of the invention.

The matching Bee_M_PHY Hard IP (RAM Side) packet physical layer interface is implemented in a DRAM-optimized process that is equivalent to a 100 to 130 nm CMOS process (1 to 1.2 V Vdd), is low power, and uses one of Kandou's vector signaling codes. It is optimized for low power. The differences from the controller-side interface include the following.

Some embodiments may include an additional processor interface accessible from the link. It may be configured to connect to link layer IP (Bee_M_LINK). It may be configured to consume 6.4 mw/Gbps (76.9 mw) worst case power dissipation (12 Gb/s), and be implemented with a 0.95 mm square of implementation footprint for interface elements in DRAM integrated circuit design. The transmitter sends data on each rising edge of the received clock, and the transmitter slew rate is controlled. Multi-drop support is provided via the combination of the chip select assertion and the enumeration. The H_IDLE signal line is driven within a fixed interval after chip select assertion qualified with the enumeration, while the H_START signal line is driven within a fixed interval after the H_IDLE signal line is driven. The Bee_M_LINK delivers a 24 bit interface to the PHY and provides transaction timing to PHY. In some embodiments, it is configured in accordance with a 4:1 parallel implementation.

The Receiver is configured with on-die termination, and a statically wired external pin determines whether termination is applied. In some embodiments, no PLL or CDR is required, as it is configured with DDR forwarded differential clock. When the chip select is asserted, the PHY circuit is configured to finds the H_IDLE and H_START H4 symbols. The ecoder transforms H4 symbols into tri-bits plus the start symbol. In addition, the Gearbox transforms the tri-bits plus the start symbol into a 24-bit interface to Bee_M_LINK. The circuit is configured for low power consumption when all input wires are floating at the common mode, and may include a 1:4 parallel implementation.

Power management functions may include (i) power down by removal of power and/or (ii) fast resumption low power standby mode with the state of the wires controlled, rapid detection and indication of activity on the clock, and standby-active transitions via a state machine based on the clock activity.

Manufacturing aspects include (i) marginable manufacturing loopback BERT test that is useful in-system between Bee devices; (ii) JTAG 1149.6 boundary and internal scan; (iii) 1 KV HBM and 250 V CDM ESD tolerance; and (iv) fully characterized and extended life tested post-silicon.

Figure 5:
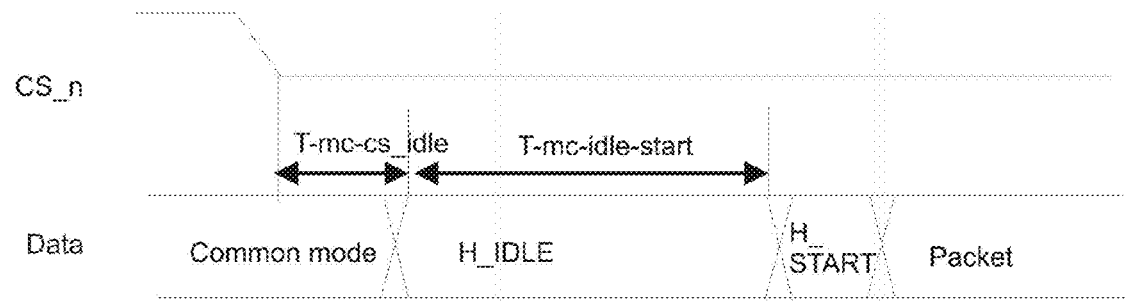
FIG. 5 is a timing diagram for the controller-to-memory packet start timing from the aspect of the memory device, in accordance with at least one embodiment of the invention.

FIG. 5 is a timing diagram for the controller-to-memory packet start timing from the aspect of the memory device, in accordance with at least one embodiment of the invention.

The Bee_M_Link Hard IP physical layer interface is, in some embodiments, implemented in a 60 nm process that multiplexes and times the data for the Bee_M_PHY. It is optimized for low power. The interface connects to the Bee_M_PHY and to the memory controller inside of the RAM.

The PHY-side receive circuit provides the timing windows for the Bee_M_PHY to look for the H_START packet indication and provides the Bee_M_PHY and end of packet signal derived from the P_Length field. It may be configured to accept a 24 bit input from the interface from Bee_M_PHY and drives it into the FIFO, and may use cut-thru operation for low latency. The receive circuit writes the results of the CRC calculation after the packet into the FIFO.

The memory-side receiver circuit manages the 24 bit wide Rx FIFO occupancy by pessimistically back-pressuring the Tx side bus interface taking into account Rx-FIFO needs of incoming transactions and the existing Rx-FIFO occupancy. The receiver also: (i) performs response matching of returned packets; (ii) handles link layer packets via a non-FIFO path; (iii) formats the KML responses back into bus transactions suitable for handling by the memory controller; and/or (iv) implements a link layer retry protocol, at the cost of increased latency.

The memory-side transmit circuit is configured to (i) accept full bus transactions from the memory controller; (ii) format those transactions into Kandou Memory Link (KML) packets; (iii) is compatible with the OFNI command set to operate the bi-directional request-response data bus; (iv) prepends a fixed link layer preamble; (v) postpends a link CRC; (vi) drives those packets into a 24 bit wide FIFO along with the start and end of packet information; (vii) manages the Tx FIFO occupancy by pessimistically back-pressuring the bus interface taking into account the input from the receive side; and in some embodiments implements a link layer retry protocol, at the cost of increased latency.

The PHY-side transmit circuit drives a 24 bit wide interface out of the FIFO to the Bee_M_PHY and drives the start and end of packet timing into the gearbox in the Bee_M_PHY.

The enumeration function automatically enumerates a daisy chain of memory devices using the ENi and ENo pins to extend the addressability of the chip selects as per the OFNI specification or an extension of that specification.

FIG. 6 describes a use of the Kandou H4 Line Code as part of a communications protocol in accordance with at least one embodiment of the invention. KH4C is a 3b4w (3 bits over 4 wires) code appropriate for narrow high performance interfaces. It is a balanced code of four symbols per codeword, one symbol taking on the value +1 or −1, with the remaining three symbols taking on the value −⅓ or +⅓, respectively.

Another embodiment of the invention supports a 3b5w (3-bits conveyed over 5 wires) code where each data value may be encoded as either of two equivalent codewords. Alternation of such equivalent codewords provides an effective return clock, making receipt of a sequence of such code words self-clocking. Another embodiment provides two additional clock lines that a selected memory device uses to reflect its received clock back to the controller, similarly providing synchronization of symbols transmitted in the memory-to-controller direction.

The following is a description of the Kandou Memory Link (KML) protocol, in accordance with at least one embodiment of the invention. KML is a protocol appropriate for a high-speed, narrow interface to a memory device. It supports variable-size block write and block read operations at arbitrary start addresses, with data transfer integrity verified using a cyclic-redundancy check code. The protocol may also optionally support access to link-level command/information packets for use by additional control and monitoring applications.

The memory side send a response packet or a link layer packet.

In the memory to controller direction, a 1 symbol preamble is added: H_START.

In the controller to memory direction, a 1 symbol preamble is added: H_START.

Write Packets
P_Command—8 bits
P_SeqNum—4 bits (TBD—if retry)
P_Tag—4 bits
P_Address—32 bit
P_Length—8 bits
P_Data—8 to 2048 bits
P_CRC—8 to 32 bits
Read Request Packets
P_Command—8 bits
P_SeqNum—4 bits (TBD—if retry)
P_Tag—4 bits
P_Address—32 bit
P_Length—8 bits
P_CRC—8 to 32 bits
Response Packets
P_Command—8 bits
P_SeqNum—4 bits (TBD—if retry)
P_Tag—4 bits
P_Length—8 bits
P_Data—8 to 2048 bits
P_CRC—8 to 32 bits
Link Layer Packets (for Some Embodiments)
P_Command—8 bits
P_Info—16 bits
P_CRC—8 to 32 bits In one embodiment, a collection of interconnection signal lines; a memory-controller interface circuit; a link layer signaling protocol control circuit; a physical layer signaling protocol control circuit that maps symbols of a vector signaling code to the collection of interconnection signal lines and provides timing information for symbol communication, wherein the link layer signaling protocol circuit provides bidirectional address and data transmission to the memory controller interface circuit. The collection of interconnection signal lines may take the form of four bidirectional data lines and two clock lines. In a further embodiment, the physical layer signaling protocol control circuit communicates three data bits over the four data lines using a balanced code of symbols having four distinct signal levels. The collection of interconnection signal lines may additionally comprise two clock lines carrying a return clock signal to the controller device. In yet a further embodiment, the collection of interconnection lines comprises five bidirectional data lines and two clock lines. In a further embodiment, the physical layer signaling protocol control circuit may communicate three data bits over five lines, and the link layer protocol circuit is self-clocking in the memory-to-controller direction.

In a further embodiment, a method comprises: transmitting messages from a memory controller using a vector signaling code, the messages selected from the group consisting of a memory write, a memory read, and a status interrogation command; receiving a response message in the form of one or more vector signaling codes, the response message selected from the group consisting of a memory write complete, a memory read result, a status response, and an error report message, wherein each transmitted message and received response message comprises a series of vector signaling code words, each code word communicated as symbols carried as physical signals on a set of lines, and wherein consecutive code words of each message is synchronized by a symbol clock also carried as physical signals on the set of lines. The memory write and memory read operations may be configured to access a contiguous block of memory of a specified size at a specified memory address. The set of lines in one embodiment comprises four bidirectional data lines and two unidirectional symbol clock lines. In a further embodiment, the vector signaling code communicates three binary bits on four lines using a balanced code of four levels. In other embodiments, the series of vector signaling words corresponding to the response message is self-clocking. The self-clocking may be obtained by receipt of a physical clock signal at the memory controller. The self-clocking may be obtained by alternation of redundant code words of the vector signaling code representing the same data value.

What is claimed is:

1. An apparatus comprising:
a physical layer signaling protocol control circuit configured to receive consecutive codewords of a vector signaling code, each codeword represented as a set of symbols received synchronously over a collection of interconnection signal lines, the consecutively received codewords collectively representing an encoded message packet, the physical layer signaling protocol control circuit configured to decode the symbols of each consecutively received codeword into consecutive sets of data bits, and to form a set of link layer bits representing a message packet by concatenating the consecutive sets of data bits, the message packet associated with the encoded message packet and selected from the group consisting of a memory write packet, a memory read packet, and a status interrogation command packet; and,
a link layer signaling protocol control circuit configured to generate a set of memory transaction signals based on the set of link layer bits, and to provide the set of memory transaction signals to a memory controller.

2. The apparatus of claim 1, wherein the link layer bits comprise 24 bits, and each consecutive set of bits comprises 3 data bits.

3. The apparatus of claim 1, wherein the message packet is a Kandou Memory Link (KML) packet.

4. The apparatus of claim 1, wherein the vector signaling code is an H4 code.

5. The apparatus of claim 1, wherein the consecutive sets of symbols of codewords are self-clocking.

6. The apparatus of claim 1, wherein:
the link layer signaling protocol control circuit is further configured to receive a second set of memory transaction signals from the memory controller and to responsively generate a second set of link layer bits representing the second set of memory transaction signals as a second message packet, wherein the second message packet is selected from the group consisting of a memory write complete packet, a memory read result packet, a status response packet, and an error report message packet; and,
wherein the physical layer signaling protocol control circuit is further configured to receive the second set of link layer bits, to select a set of data bits from the link layer bits, to form a transmission codeword of the vector signaling code based on the selected set of data bits, the code word comprising a second set of symbols, to map the second set of symbols of the transmission codeword to the collection of interconnection signal lines and to synchronize symbol communication via symbol clock lines.

7. The apparatus of claim 6, wherein the collection of interconnection signal lines comprises four bidirectional data lines and two symbol clock lines.

8. The apparatus of claim 7, wherein the physical layer signaling protocol control circuit communicates three data bits over the four data lines using a balanced code of symbols having four distinct signal levels.

9. The apparatus of claim 8, wherein the collection of interconnection signal lines additionally comprises two clock lines carrying a return clock signal to the physical layer signaling protocol control circuit.

10. The apparatus of claim 6, wherein the collection of interconnection lines comprises five bidirectional data lines and two symbol clock lines.

11. A method comprising:
receiving consecutive codewords of a vector signaling code, each codeword represented as a set of symbols received synchronously over-a collection of interconnection signal lines, the consecutive received codewords collectively representing an encoded message packet;
decoding the consecutive sets of symbols of each codeword into consecutive sets of data bits, and forming a set of link layer bits representing the second message packet by concatenating the consecutive sets of data bits, the message packet associated with the encoded message packet and selected from the group consisting of a memory write packet, a memory read packet, and a status interrogation command packet;
generating a set of memory transaction signals based on the set of link layer bits; and,
providing the set of memory transaction signals to a memory controller.

12. The method of claim 11, wherein the link layer bits comprise 24 bits, and each consecutive set of bits comprises 3 data bits.

13. The method of claim 11, wherein the message packet is a Kandou Memory Link (KML) packet.

14. The method of claim 11, wherein the vector signaling code is an H4 code.

15. The method of claim 11, wherein the consecutive sets of symbols of codewords are self-clocking.

16. The method of claim 11, further comprising:
receiving a second set of memory transaction signals from the memory controller and responsively generating a second set of link layer bits representing the second set of memory transaction signals as a second message packet, wherein the second message packet is selected from the group consisting of a memory write complete packet, a memory read result packet, a status response packet, and an error report message packet;
selecting a set of data bits from the link layer bits, and responsively forming a transmission codeword of the vector signaling code based on the selected set of data bits, the code word comprising a second set of symbols
mapping the second set of symbols of the transmission codeword to the collection of interconnection signal lines; and,
synchronizing symbol communication via symbol clock lines.

17. The method of claim 16, wherein the collection of interconnection signal lines comprises four bidirectional data lines and two symbol clock lines.

18. The method of claim 17, wherein the physical layer signaling protocol control circuit communicates three data bits over the four data lines using a balanced code of symbols having four distinct signal levels.

19. The method of claim 18, wherein the collection of interconnection signal lines additionally comprises two clock lines carrying a return clock signal to the physical layer signaling protocol control circuit.

20. The method of claim 16, wherein the collection of interconnection lines comprises five bidirectional data lines and two symbol clock lines.

\* \* \* \* \*